United States Patent
Foncellino et al.

(10) Patent No.: US 9,012,259 B2
(45) Date of Patent: Apr. 21, 2015

(54) THIN FILM TRANSISTORS FORMED BY ORGANIC SEMICONDUCTORS USING A HYBRID PATTERNING REGIME

(71) Applicant: STMicroelectronics S.r.l., Agrate Brianza (IT)

(72) Inventors: Francesco Foncellino, Caserta (IT); Giovanna Salzillo, Teverola (IT); Valeria Casuscelli, Naples (IT); Luigi Giuseppe Occhipinti, Ragusa (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/157,097

(22) Filed: Jan. 16, 2014

(65) Prior Publication Data

US 2014/0199807 A1    Jul. 17, 2014

(30) Foreign Application Priority Data

Jan. 17, 2013    (IT) ................ VI2013A0008

(51) Int. Cl.
*H01L 51/40*    (2006.01)
*H01L 51/05*    (2006.01)
*H01L 51/00*    (2006.01)

(52) U.S. Cl.
CPC ........ *H01L 51/0545* (2013.01); *H01L 51/0005* (2013.01); *H01L 51/0023* (2013.01); *H01L 51/0525* (2013.01)

(58) Field of Classification Search
USPC .......................................................... 438/99
See application file for complete search history.

(56) References Cited

U.S. PATENT DOCUMENTS

| | | | |
|---|---|---|---|
| 2008/0241990 A1* | 10/2008 | Kim et al. ................ | 438/99 |
| 2009/0008667 A1 | 1/2009 | Fujii et al. | |
| 2009/0140648 A1* | 6/2009 | Tohyama et al. ........... | 313/505 |
| 2013/0099215 A1* | 4/2013 | Kushida et al. ............ | 257/40 |

FOREIGN PATENT DOCUMENTS

| | | | |
|---|---|---|---|
| EP | 2 136 606 A1 | 12/2009 | |
| JP | WO2011142267 | * 11/2011 | |

OTHER PUBLICATIONS

Italian Search Report for corresponding Italian application No. VI20130008, dated Jun. 6, 2013, 8 pages.
Fukuda et al., "Organic Pseudo-CMOS Circuits for Low-Voltage Large-Gain High-Speed Operation," *IEEE Electron Device Letters* 32(10):1448-1450, Oct. 2011.
Zschieschang, Ute et al. "Mixed Self-Assembled Monolayer Gate Dielectrics for Continuous Threshold Voltage Control in Organic Transistors and Circuits", Advanced Materials, 2010, 22, 4489-4493; 1-5.

(Continued)

*Primary Examiner* — Karen Kusumakar
(74) *Attorney, Agent, or Firm* — Seed IP Law Group PLLC

(57) ABSTRACT

The present disclosure describes a process strategy for forming bottom gate/bottom contact organic TFTs in CMOS technology by using a hybrid deposition/patterning regime. To this end, gate electrodes, gate dielectric materials and drain and source electrodes are formed on the basis of lithography processes, while the organic semiconductor materials are provided as the last layers by using a spatially selective printing process.

21 Claims, 8 Drawing Sheets

(56) References Cited

OTHER PUBLICATIONS

Klauk et al., "Ultralow-power organic complementary circuits," *Nature* 445:745-748, Feb. 15, 2007.

Kang Dae Kim et al. "Low voltage pentacene thin film transistors employing a self-grown metal-oxide as a gate dielectric" Applied Physics Letters 88, 233508, 2006, 4 pages.

* cited by examiner

THIN FILM TRANSISTORS FORMED BY ORGANIC SEMICONDUCTORS USING A HYBRID PATTERNING REGIME

BACKGROUND

1. Technical Field

Generally, the present disclosure relates to the field of semiconductor based devices, such as devices including thin film transistors (TFT) that are formed on the basis of organic semiconductor materials.

2. Description of the Related Art

Immense progress has been made in the field of semiconductor production techniques by steadily reducing the critical dimensions of circuit elements, such as transistors, in integrated circuits. For example, critical dimensions of 30 nm and less have been implemented in highly complex logic circuitry and memory devices, thereby achieving high packing density. Consequently, more and more functions may be integrated into a single semiconductor chip, thereby providing the possibility of forming entire systems on a chip so that highly complex electronic circuits may be implemented on the basis of a common manufacturing process. Complex integrated circuits that are produced on the basis of volume production techniques are mainly based on CMOS technology using silicon as semiconductor base material due to the many advantages of silicon in terms of availability, costs, well-established production technology and the like. The significant advance of silicon-based products can mostly be attributed to the remarkable reduction of critical dimensions, thereby allowing the production of an ever increasing number of integrated circuits on a single wafer. Nevertheless the cost of well-established silicon-based production techniques per unit area are still high and may not be compatible with economic demands when considering electronic devices used for large area applications. For example, flexible cost efficient displays, RFID tags for many types of products, and the like represent typical applications, in which low production costs rather than extremely reduced critical dimensions substantially determine economic success of a corresponding technology.

In this respect organic thin-film transistors and integrated circuits fabricated on the basis of such organic TFTs have gained in importance over the recent years due to their capability of being produced on the basis of less demanding production techniques compared with well-established semiconductor fabrication technologies. Basically organic TFTs are encountered in four different types of structures, each of which may have advantages and disadvantages in terms of production process related issues and/or performance. One type of transistor structure is the bottom gate and top contact type, in which a gate electrode is formed on an appropriate substrate, followed by a dielectric material that serves as gate dielectric material and also encapsulates the gate electrode. Thereafter, the organic semiconductor material is provided, followed by the source and drain electrodes. Consequently, by applying cost efficient deposition techniques for the various materials, for instance for the organic semiconductor material and the source and drain material, for instance provided on the basis of a metal, such as gold, the deposition process for the source and drain electrodes may have to be carefully selected with respect to the organic semiconductor material. For example, one frequently used deposition technique is inkjet printing, which typically specifies that the conductive material for the electrodes to be printed on the basis of a solvent. Hence, this solvent has to be selected so as to not substantially interfere with the previously formed organic semiconductor material, thereby significantly limiting the number of available conductive inks that are available for inkjet printing. Furthermore, organic semiconductor materials may frequently have a hydrophobic surface, which may reduce adhesion of the source and drain materials, thereby reducing overall reliability. Furthermore, a top gate and bottom contact structure may be used, which is similar to well-established silicon-based planar transistor architectures, in which source and drain electrodes or regions are formed above the substrate, followed by the organic semiconductor material. Thereafter, an insulating material is provided, followed by the gate electrode. In this type of structure the organic semiconductor material is deposited as the second layer, so that subsequent process steps, such as printing and curing of subsequent materials may result in a deterioration of the semiconductor material. Therefore, the selection of materials and solvents, when considering inkjet printing, is extremely challenging.

For this reason, in many approaches the organic semiconductor material is provided as a last layer of the basic transistor configuration. A widely used structure in this respect is the back gate and bottom contact type, in which frequently a heavily doped silicon substrate is used as a carrier material, while at the same time serving as the back gate electrode. A dielectric material is formed on the gate electrode layer, for instance in the form of a thermally grown oxide. The source and drain electrodes are typically deposited by evaporation of an appropriate metal, such as gold, which is patterned by a lift-off method. The organic semiconductor material is frequently spin coated or printed, for instance inkjet printed, so as to complete the basic transistor structure. Due to the full overlap between the source and drain electrodes and the back gate a moderately high parasitic capacitance is encountered, thereby significantly reducing overall transistor performance. On the other hand, this structure may be favorable for printing processes, since the semiconductor material is provided as the last layer, thereby avoiding any solvent attack that may occur in other configurations, when incompatible solvents have to be used for printing another device layer, such as a metal layer, onto the semiconductor material.

In order to address the significant parasitic capacitance of the back gate and bottom contact transistor structure, previously described, a further transistor configuration has been proposed, in which the sequence of different material layers is maintained, wherein, however, a patterned gate electrode is provided. This configuration is referred to as a bottom gate and bottom contact structure. The patterned gate electrode may be contacted on the basis of an appropriate bottom contact regime, while nevertheless reducing the parasitic overlap between the gate electrode and the drain and source electrodes.

FIG. 1A schematically illustrates a cross-sectional view of an organic transistor structure 150 according to a bottom gate bottom contact (BGBC) structure type. As shown, the transistor structure 150 comprises a substrate 101, which may represent any appropriate carrier material, such as a semiconductor material, glass, plastic, and the like, which may even be flexible, depending on the type of application, for which an electronic device including the transistor structure 150 is to be used. A patterned gate electrode 151 comprised of an appropriate metal, such as aluminum, is formed on the substrate 101 and has appropriate lateral dimensions so as to comply with the overall layout of the transistor structure 150. A dielectric material 152, such as an organic dielectric, and the like is formed above the gate electrode 151, thereby serving as a gate dielectric material. Moreover, the dielectric material 152 may also be provided laterally adjacent to the gate electrode 151 in order to electrically insulate and confine the gate electrode 151. Drain and source electrodes 153/154 are formed on the gate dielectric material 152 with a desired extension along a transistor width direction, i.e., a direction perpendicular to the drawing plane of FIG. 1A, while the transistor length is determined by the lateral distance of the drain and source electrodes 153/154. Moreover, an organic semiconductor material 155, such as pentacene, and the like, is formed above and between the drain and source electrodes 153/154. As is evident from FIG. 1A, by appropriately dimensioning the gate electrode 151 and the drain and source electrodes 153/154 a desired channel length may be determined without inducing undue parasitic capacitance, since the overlap of the gate electrode 151 with the drain and source electrodes 153/154 may be adjusted in terms of transistor performance by appropriately adjusting the lateral dimensions of the gate electrode 151.

Since the specifications with respect to critical dimensions of organic thin film transistors are significantly less demanding compared to cutting edge bulk silicon technology, the patterning of the various material layers is frequently achieved on the basis of physical vapor deposition using a shadow mask, which in turn may result in reduced overall production yield due to the moderately complex process and the interference of the shadow mask with the deposited material upon removing the mask. In other approaches, as discussed above, the deposition may be accomplished on the basis of spin coating and/or dipping processes, in which the actual materials are deposited in combination with an appropriate solvent, thereby requiring subsequent patterning, for instance by photolithography, imprint techniques and the like. Basically blanket-deposition techniques in combination with lithography processes are precise and well-established methods for patterning various material layers, however, these techniques significantly contribute to overall production costs, in particular for organic semiconductor devices, in which lithography cost per unit area are moderately high due to significantly reduced device density compared to cutting edge silicon technology. Therefore, other deposition techniques, such as inkjet printing, have been proposed in order to form patterned material layers by using solvent-based conductive and insulating materials. These printing techniques also typically are followed by further processing, such as to provide high degree of compatibility of the various solvents in order to avoid significant material deterioration caused by the subsequent printing and treatment of the solvent of a subsequent material layer.

Based on the above described process technologies a plurality of types of electronic devices including organic TFTs have been produced so as to address the increasing demand for cost efficient electronic products. In earlier approaches exclusively p-type TFTs have been used due to the less critical availability of p-type organic semiconductor materials of moderate charge carrier mobility and a sufficient stability, thereby allowing the fabrication of active displays, sensors and the like. For example, pentacene in combination with gold electrodes, which match the highest occupied molecular orbital (HOMO)-lowest unoccupied molecular orbital (LUMO) regime of the pentacene, results in appropriate transistor performance. On the other hand, there are significant advantages involved in implementing p-type transistors and also n-type transistors when producing complex electronic circuits. For example, in standard inorganic semiconductor devices CMOS circuits exhibit a significantly reduced power consumption due to the fact that power is mainly dissipated during transistor switching operations, while extremely low power consumption occurs in the steady-state of the transistors. That is, CMOS circuits consume significantly less power compared to n-MOS or p-MOS devices. Although it is believed that in organic circuits power dissipation is dominated by leakage currents, nevertheless significant effort has been made in order to design complementary circuits on the basis of organic TFTs. Furthermore, advantages, such as reduced design complexity, greater speed, superior immunity to noise effects and reduced sensitivity to transistor characteristics, as are encountered in standard silicon CMOS technology, may also represent important improvements in organic circuits when based on complementary transistors. Therefore, extensive research has been done in recent years in order to provide n-type organic semiconductor materials that exhibit sufficient carrier mobility and stability during processing and after finishing the electronic product. For example, hexadecafluorocopper phthalocyanine ($F_{16}CuPc$) or materials from the oligothiophene, fullerene and rylene imide groups have been identified as appropriate n-type materials.

Upon forming organic circuits on the basis of complementary TFTs, however, the deposition of two different types of organic semiconductor materials may result in additional process complexity, for instance requiring additional photolithography and patterning processes so as to provide the two different semiconductor materials with appropriate lateral position, size and shape. When avoiding lithography techniques, for instance by using a spatially selective deposition technique on the basis of a shadow mask, a further reduction in overall production yield may be observed due to the interference of the additional shadow mask with the sensitive material deposited.

Although recent research has revealed that the same type of organic semiconductor material may exhibit different conductivity types in combination with different metal electrodes and/or dielectric materials provided at the interface to the organic semiconductor material, nevertheless also in this case additional significant complexity is associated with the fabrication of CMOS devices. For example, sophisticated gate dielectric materials with reduced thickness and specified molecular structure may have to be used in order to appropriately control the conductivity type at the interface to the organic semiconductor material in order to adjust the desired transistor behavior. For example, frequently so-called self assembling monolayers (SMAs) may be used as a gate dielectric in order to appropriately adjust interface characteristics. On the other hand, although desirable with respect to enhanced controllability of the channel region, a dielectric material of reduced thickness may even further contribute to increased leakage currents, which may represent a considerable contribution to the overall power losses of organic circuits, as already discussed above.

In view of the difficulties associated with the formation of organic CMOS devices several approaches have been proposed in order to address at least some of the above-identified problems. For example, in "Organic Pseudo-CMOS Circuits for Low-Voltage Large-Gain High-Speed operation", IEEE ELECTRON DEVICE LETTERS, VOL. 32, NO. 10, October 2011, organic TFTs are described, which are appropriately connected in order to implement a CMOS-like circuit so as to gain at least some of the advantages of a CMOS design, while circumventing some of the problems associated with the provision of two types of organic semiconductor materials.

FIG. 1B schematically illustrates a cross-sectional view of a transistor structure 150, in which a gate electrode 151 comprised of aluminum is formed on a substrate 101. A gate dielectric material includes a first dielectric layer 152A made of aluminum oxide and a second dielectric layer 152B comprised of an organic material of self aligned monolayers (SAM) with a reduced thickness of approximately 2 nm. Then, an organic semiconductor material 155 in the form of DNTT (dinaphto[2,3-b:2',3'-f]thieno[3,2-b]thiophene) is provided with a thickness of approximately 30 nm, followed by drain and source electrodes 153/154 made of gold. The organic TFTs described in this document have been manufactured by vacuum evaporation and low-temperature solution processes, wherein the vacuum evaporation processes have been performed on the basis of respective shadow masks. The gate dielectric material 152B may be provided on the basis of a complex and long solution process.

Although the transistor shown in this document provides for moderately high mobility and thus switching speed, nevertheless reduced device density is associated with the pseudo-CMOS design, since four TFTs 150 are used to implement an inverter structure, which in CMOS design is achieved on the basis of one p-type transistor and one n-type transistor.

In view of the situation described above there is an increasing demand for organic circuits with superior performance with respect to operating characteristics, which may be fabricated on the basis of process technologies that provide for superior production yield, such as photolithography techniques, compatibility with industrial standards for volume production, yet allowing a very cost effective manufacturing flow in order to meet economic constraints for a wider field of electronic products.

BRIEF SUMMARY

According to one or more embodiments of the present disclosure there is provided a method of forming a thin-film transistor. In one embodiment the method comprises forming a gate electrode, a gate dielectric and source and drain electrodes above a substrate by using lithography techniques. The method further comprises forming a patterned organic semiconductor material by performing a printing process.

That is, the embodiment applies a hybrid process technique, in which critical processes for defining the basic transistor configuration may be performed on the basis of lithography techniques, while the actual organic semiconductor material is applied on the basis of a printing process. In this manner, the transistor dimensions determined by the gate electrode and the source and drain electrodes may be defined on the basis of a very precise process technique that is well-established and ensures superior production yield by eliminating shadow mask processes, while at the same time a high degree of repeatability is achieved. On the other hand, the one or more organic semiconductor materials are deposited in a spatially defined manner by a printing process, which may also efficiently be implemented in a volume production process line without causing additional complexity.

In one illustrative embodiment the step of forming a patterned organic semiconductor material comprises forming a p-type organic semiconductor material above the source and drain electrodes and the gate dielectric. In this manner, well-established p-type semiconductor materials in combination with appropriate electrode materials for the drain and source electrodes may be used, wherein the semiconductor material is provided as a last layer of the overall transistor configuration. In this manner, interference of materials and previous process steps with the p-type semiconductor material is effectively eliminated, thereby increasing degree of freedom for selecting appropriate solvents for printing the p-type semiconductor material.

In one preferred embodiment of the present disclosure the step of forming a patterned organic semiconductor material comprises forming an n-type organic semiconductor material above second source and drain electrodes and a second gate dielectric formed above the substrate. In particular, in combination with the previously described embodiment, i.e., the provision of a p-type semiconductor material, this embodiment enables the formation of CMOS devices, since complementary transistors are provided. That is, both the p-type organic semiconductor material and the n-type organic semiconductor material are formed on the basis of the printing process on laterally different active areas of the device, thereby also efficiently avoiding any interference of solvents used for the respective printing processes. As discussed above, providing complementary transistors for an organic circuit has several advantages, such as superior operating speed, reduced complexity of circuit design, reduced area consumption and thus increased device density, and the like. Contrary to conventional process strategies, in which complementary organic transistors are provided on the basis of additional lithography processes for patterning the different types of semiconductor materials, the approach of one or more embodiments of the present disclosure is based on a fixed number of lithography processes, irrespective of the type and number of semiconductor materials to be incorporated in the device. For example, by using printing techniques any number of semiconductor materials as desired for realizing a specific type of electronic circuit may be positioned above the previously patterned material layers, such as the gate electrode, the gate dielectric and the drain and source electrodes, without being confronted with any interference with previously performed process steps.

In one illustrative embodiment the step of forming a gate electrode comprises patterning a conductive layer formed above the substrate so as to form the gate electrode and a contact structure prior to forming the gate dielectric. According to this embodiment any appropriate material for the gate electrode may be provided in the form of the conductive layer, wherein the patterning thereof on the basis of a lithography process may additionally be used so as to obtain a contact structure in order to comply with the overall device design, for instance with respect to a bottom gate-bottom contact configuration, as is previously described.

In one illustrative embodiment the step of patterning the conductive layer comprises forming a first resist mask above the conductive layer so as to define a lateral size and shape of the gate electrode and the contact structure and removing non-covered areas of the conductive layer. Forming a resist mask on the basis of lithography techniques is well-established and allows a precise definition of the lateral position, size and shape of respective conductive regions, such as the gate electrode and the contact structure. Based on the first resist mask the non-covered areas of the conductive layer are removed by using any appropriate etch technique, such as wet chemical etch processes, plasma-based etch processes, and the like, depending on the type of material used for forming the conductive layer. For example, aluminum is a well-established electrode material in the semiconductor industry and a plurality of etch recipes are available so as to remove material in the presence of a resist mask, which in turn reliably protects underlying aluminum portions.

In a further illustrative embodiment the method further comprises selectively removing the first resist mask from above the gate electrode so as to expose a surface thereof while preserving the first resist mask above the contact structure. In this manner, the gate electrode may receive an additional treatment in order to adjust device characteristics, while still protecting the contact structure by the remaining resist mask in order to not unduly affect the overall electric characteristics thereof. For example, a surface treatment may be performed on the exposed gate electrode in order to achieve desired material characteristics in view of conductivity, dielectric behavior, and the like.

In one illustrative embodiment the step of selectively removing the first resist mask comprises selectively exposing resist material formed above the gate electrode with radiation while masking the resist material formed above the contact structure, and selectively removing the exposed resist material. To this end, an additional exposure process based on a corresponding lithography mask may be used so as to induce a desired photochemical reaction in the exposed resist material formed above the gate electrode. For example, standard UV radiation may be applied in order to enable a subsequent removal of the exposed resist material. In other illustrative embodiments exposure of the resist material formed above the gate electrode may be accomplished on the basis of any type of radiation, such as laser radiation, and the like, while a masking effect of the resist material formed above the contact structure may be accomplished by using a non-contact mask or by simply spatially restricting the radiation by using an appropriate scan process.

According to one preferred embodiment the step of forming the gate dielectric comprises exposing the surface to a surface treatment so as to form an insulating layer as a first portion of the gate dielectric. In one embodiment the surface treatment is performed in oxidizing ambient so as to form an oxide layer. In other cases the surface treatment may include the incorporation of nitrogen, and the like. In this manner, superior leakage behavior may be obtained for the gate electrode, since a portion thereof may be used as an efficient gate dielectric material. For example, when using aluminum as a gate material, exposure to an oxidizing ambient, such as ambient air, a plasma ambient, and the like, may result in a controlled growth of aluminum oxide. On the other hand, the first resist mask still preserved above the contact structure may reliably prevent the growth of oxide at least on the top surface of the contact structure.

In a further illustrative embodiment the step of forming the gate dielectric comprises depositing a dielectric material in the presence of the first resist mask preserved above the contact structure. Consequently, any appropriate dielectric material may be used so as to adjust the interface characteristics with the one or more organic semiconductor materials. In particular in combination with a previously formed insulating layer, such as an oxide layer, a significant dielectric strength may be achieved, even when a moderately reduced thickness for the additional dielectric material is selected, thereby still obtaining a reduced level of gate leakage currents, while nevertheless overall physical thickness may be reduced in order to contribute to superior controllability of the channel region.

According to a further illustrative embodiment the method further comprises the step of patterning the dielectric material so as to form an opening that extends to the contact structure. In this manner a single patterning step may be applied so as to define the overall lateral extension of the dielectric material and to form the opening in order to enable the subsequent formation of a contact plug connecting to the contact structure.

In one exemplary embodiment the step of patterning the dielectric material comprises forming a second resist mask above the dielectric material so as to define a lateral size, position and shape of the opening, performing a removal process based on the second resist mask so as to expose the first resist mask and commonly removing the first and second resist masks. According to this embodiment the second resist mask, which may be formed by any appropriate lithography strategy, is used to pattern the dielectric material, for instance by using any appropriate material removal process, such as plasma etching, and the like, wherein the first resist mask, which is still preserved above the contact structure, is used as an "etch stop" material during the removal process. Upon exposing the first resist mask the resist material of the first and second masks is removed by a common process, for instance exposing the resist material to radiation in order to induce a photochemical reaction, followed by a subsequent development process.

In one preferred embodiment the step of commonly removing the first and second resist masks comprises establishing a process atmosphere so as to prevent surface degradation of the contact structure. In some embodiments the process atmosphere is established so as to substantially avoid the formation of oxide on the exposed surface of the contact structure, thereby preserving the initial high conductivity of the conductive material used. To this end, an essentially inert atmosphere may be established, for instance on the basis of nitrogen, and the like, in order to restrict the presence of oxygen. It should be appreciated that a corresponding process atmosphere may also be maintained during the further processing of the device until a further conductive material is deposited.

In a further illustrative embodiment the step of forming the source and drain electrodes comprises forming a layer of conductive material and patterning the layer of conductive material by using a third resist mask and performing an etch process. Consequently, also in this case well established lithography techniques and patterning processes may be applied so as to form the source and drain electrodes with a high degree of precision with respect to lateral dimensions, layer thickness, and the like. For example, appropriate conductive materials for providing the drain and source electrodes are gold (Au), chromium (Cr), calcium (Ca) or any other appropriate metals, alloys, or other types of conductive materials, which appropriately match the HOMO and LUMO of the one or more semiconductor materials still to be provided.

In a preferred embodiment the step of patterning the layer of conductive material comprises forming a contact element that connects to the contact structure. Consequently, during a single deposition and patterning sequence the electrical connection to the bottom contact structure is implemented, thereby providing for the desired interconnect structure for connecting to the gate electrode and to other devices and electronic circuits to be formed below and/or above the substrate.

In one illustrative embodiment the method further comprises removing the third resist mask by exposing material of the third resist mask to radiation and removing the exposed material. Hence, well-established efficient removal techniques may be applied.

Preferably, the printing process is an inkjet printing process. As already discussed above, inkjet printing is a well-established technique that may readily be implemented into industrial environments equipped for volume production processes, wherein sensitivity to process atmospheres, surface topography and the like as well as a possible incompatibility of solvent materials to be used for the printing process may substantially be circumvented by the present disclosure in that the inkjet printing process for forming one or more organic semiconductor materials is applied as the last process for completing the transistor configuration. That is, reduced applicability in volume production techniques caused by possible incompatibility of solvents with materials and processes to be applied after the deposition of organic semiconductor materials, as is frequently encountered in conventional process strategies, may be substantially avoided. Furthermore, the previous processing of the underlying materials leads to a less pronounced surface topography compared to conventional strategies, thereby also contributing to a reliable inkjet printing process.

BRIEF DESCRIPTION OF THE SEVERAL VIEWS OF THE DRAWINGS

Further advantages embodiments of the present disclosure are defined in the appended claims and will also be described in the following detailed description, which is to be understood in the context of the attached drawings.

DETAILED DESCRIPTION

Figure 2A:
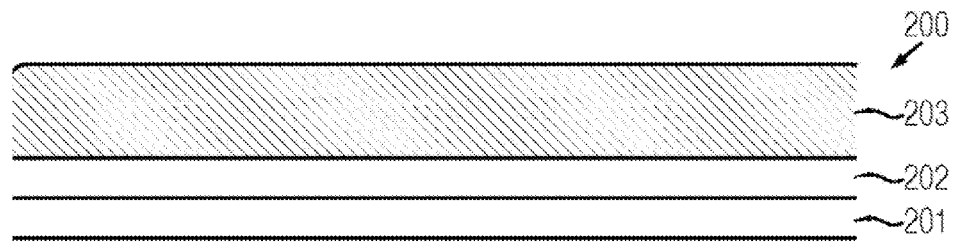
Figure 2B:
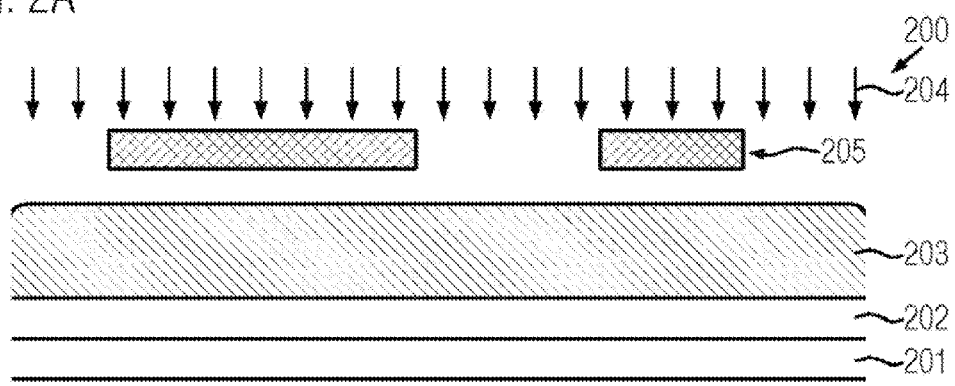
Figure 2C:
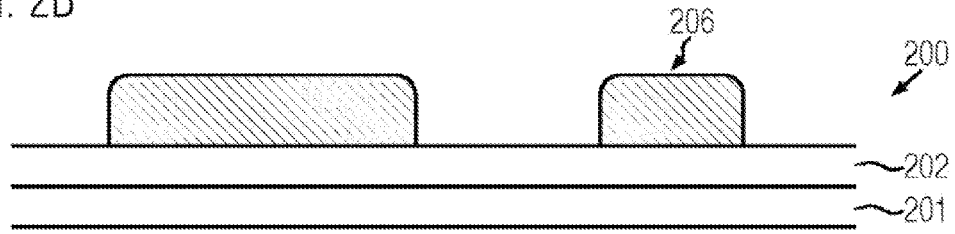
Figure 2D:
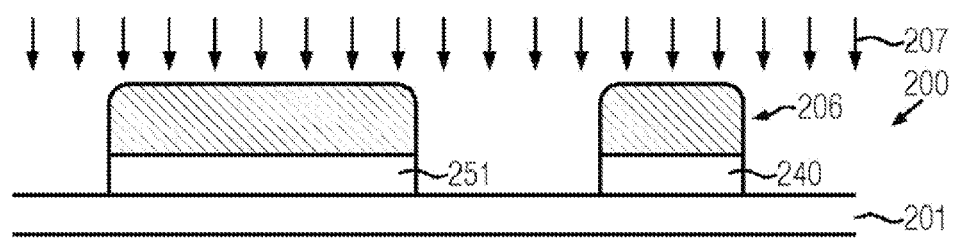
Figure 2E:
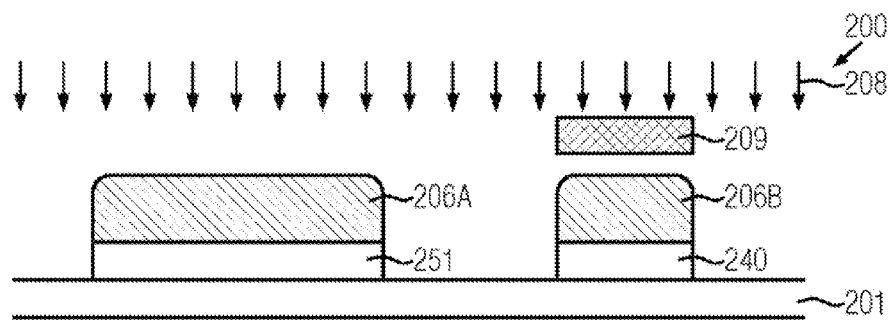
Figure 2F:
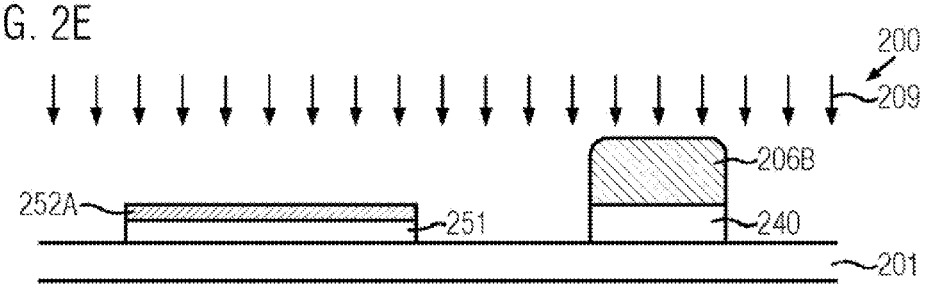
Figure 2G:
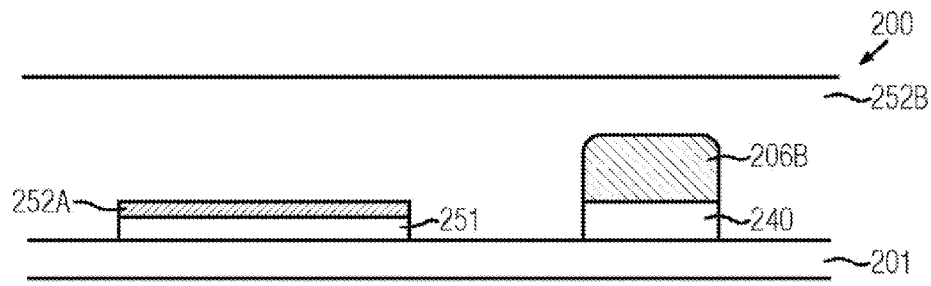
Figure 2H:
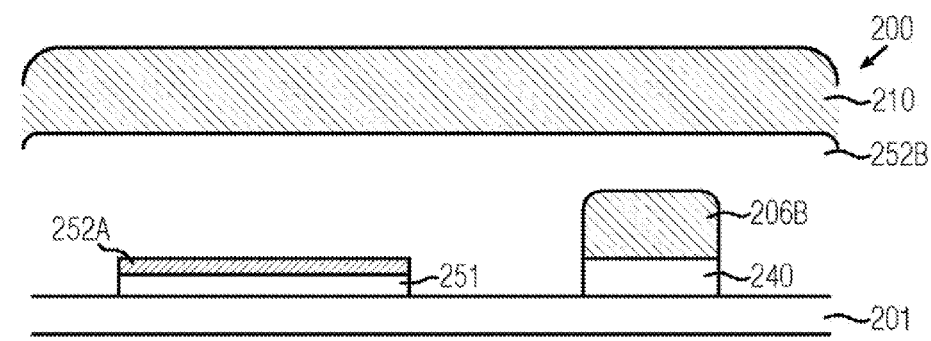
Figure 2I:
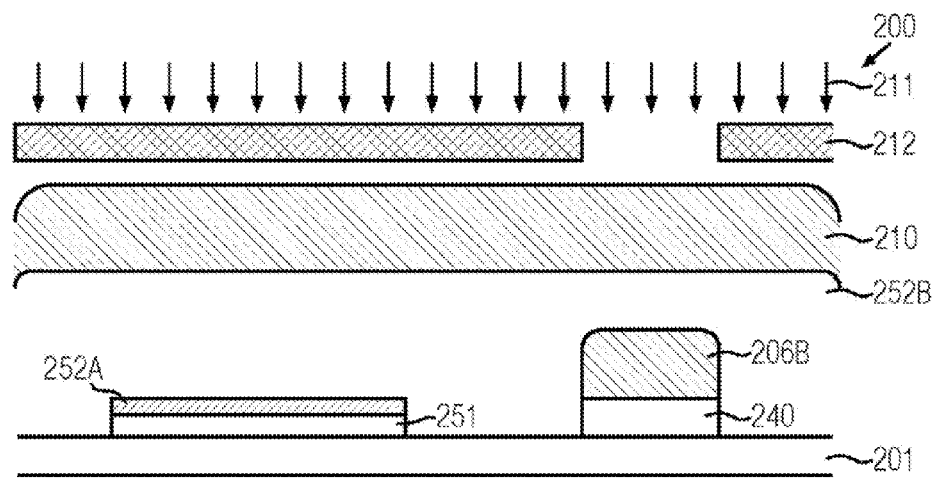
Figure 2J:
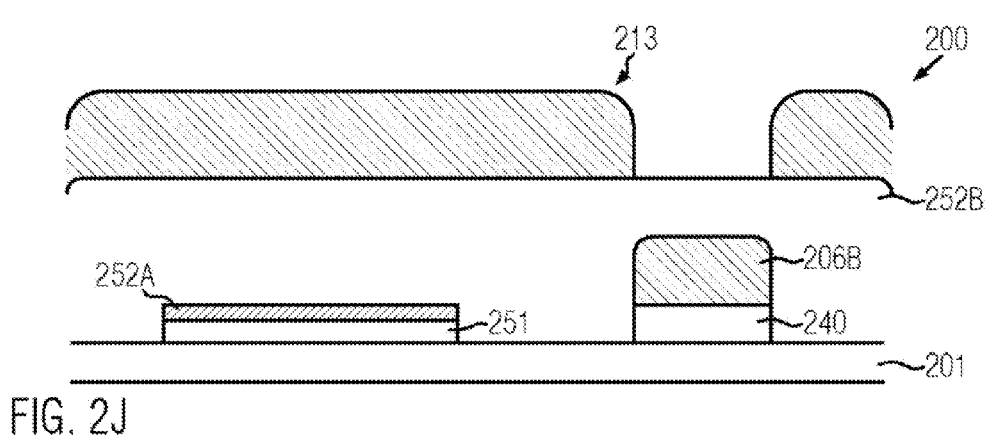
Figure 2K:
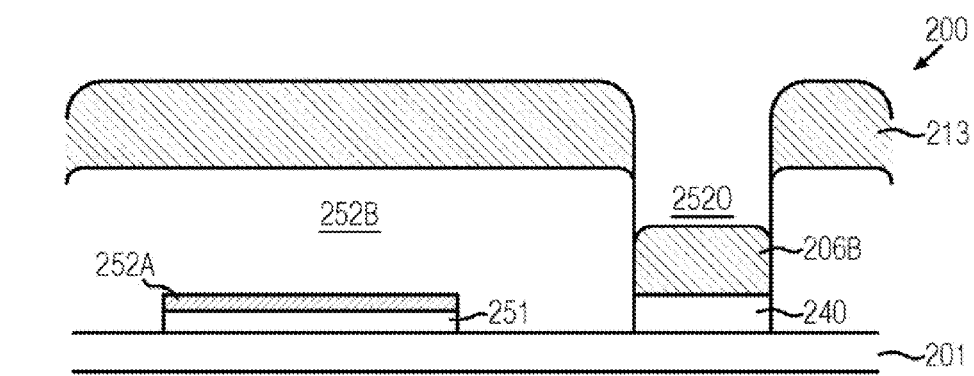
Figure 2L:
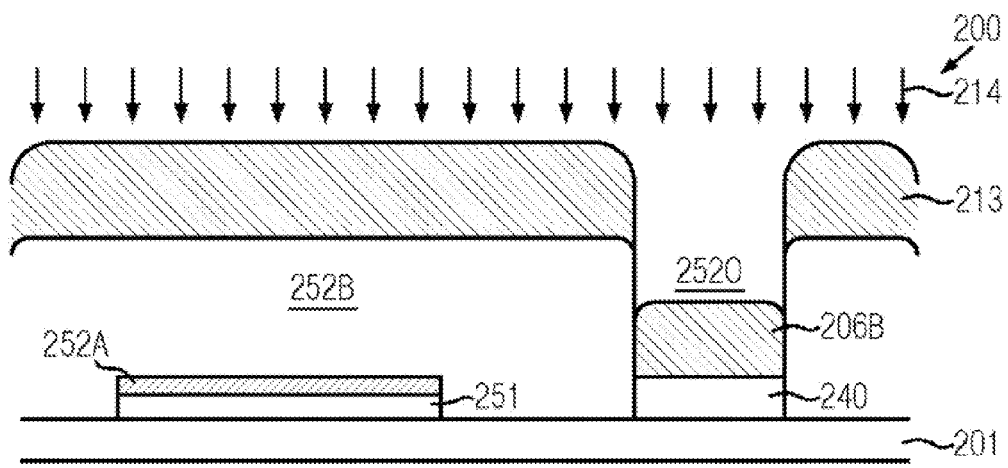
Figure 2M:
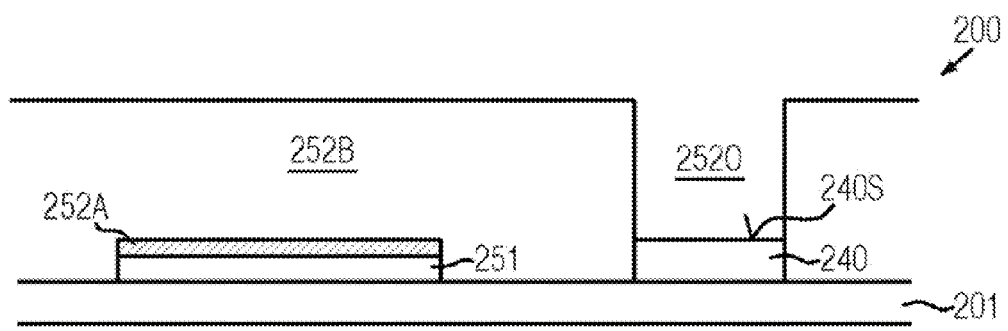
Figure 2N:
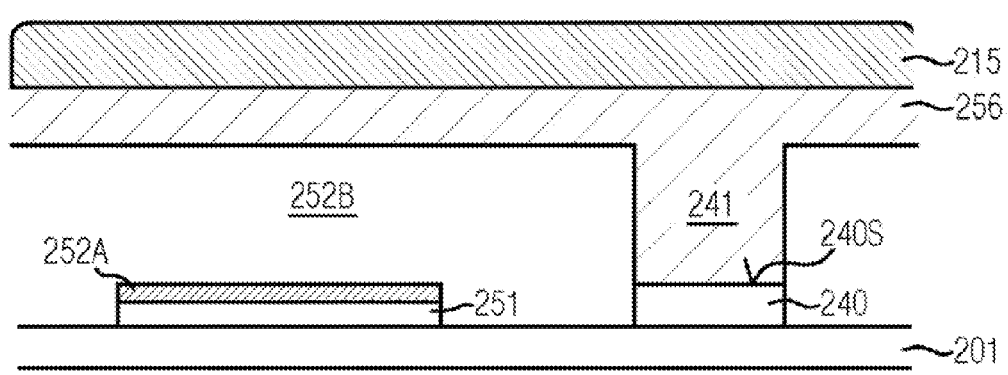
Figure 2O:
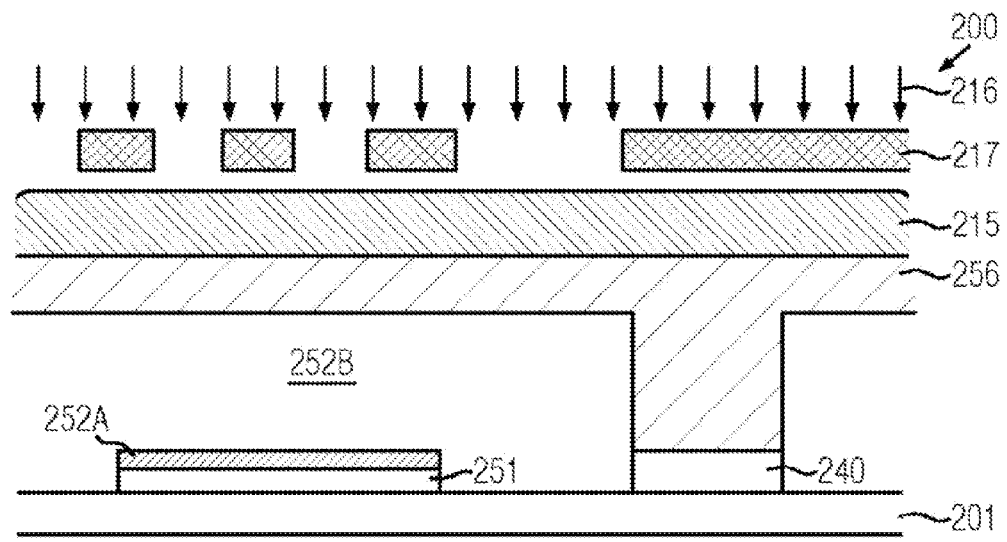
Figure 2P:
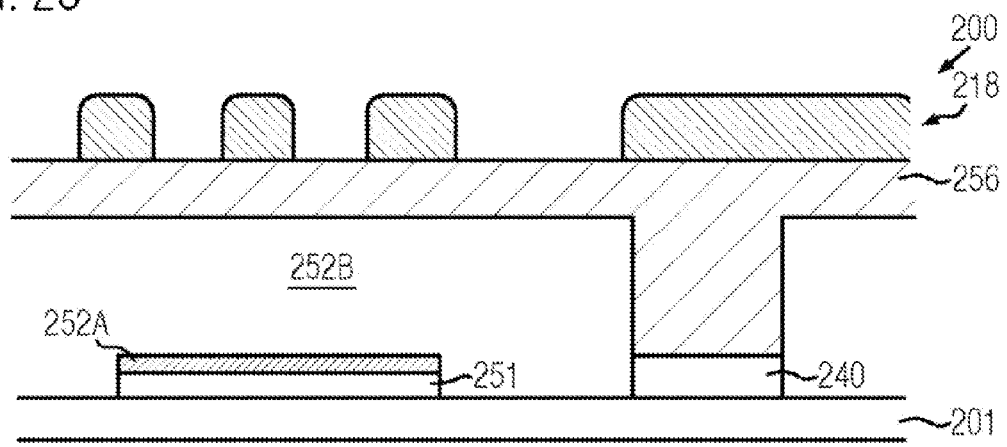
Figure 2Q:
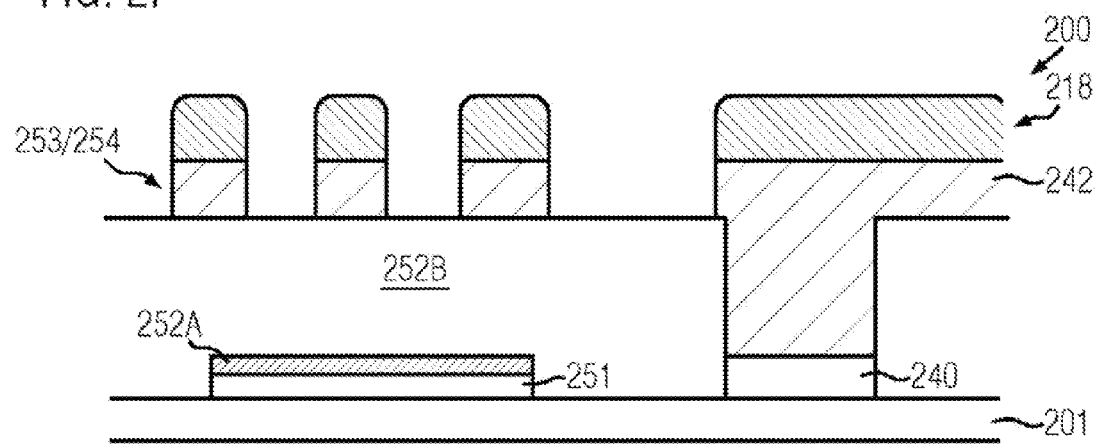
Figure 2R:
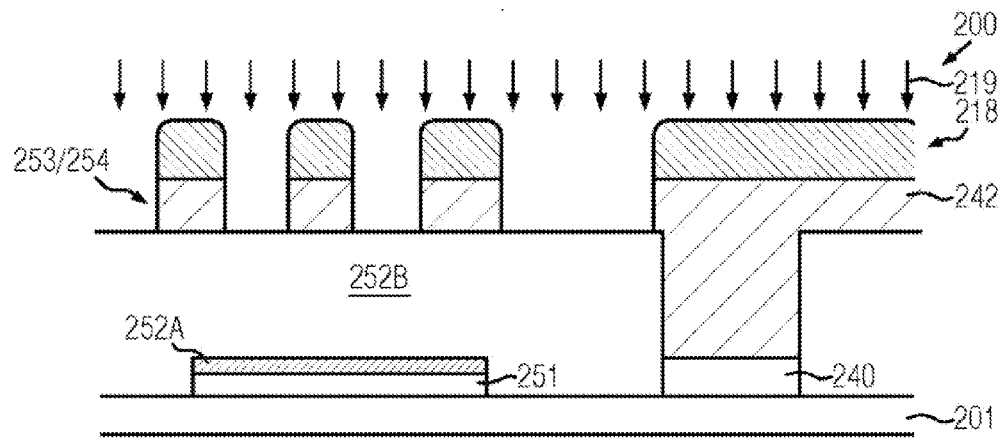
Figure 2S:
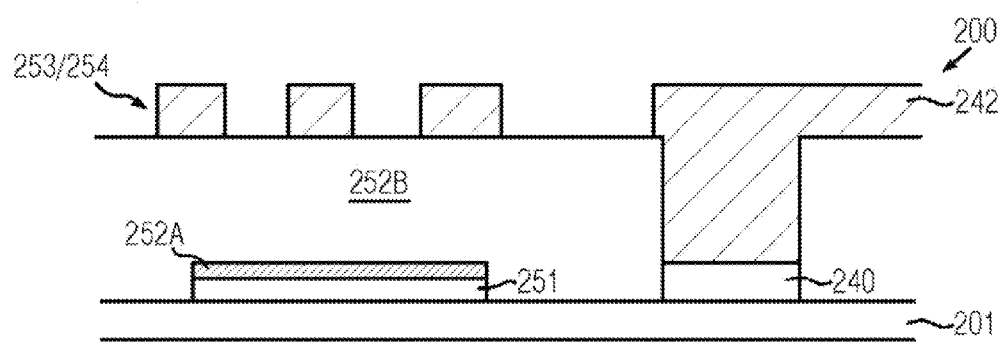
Figure 2T:
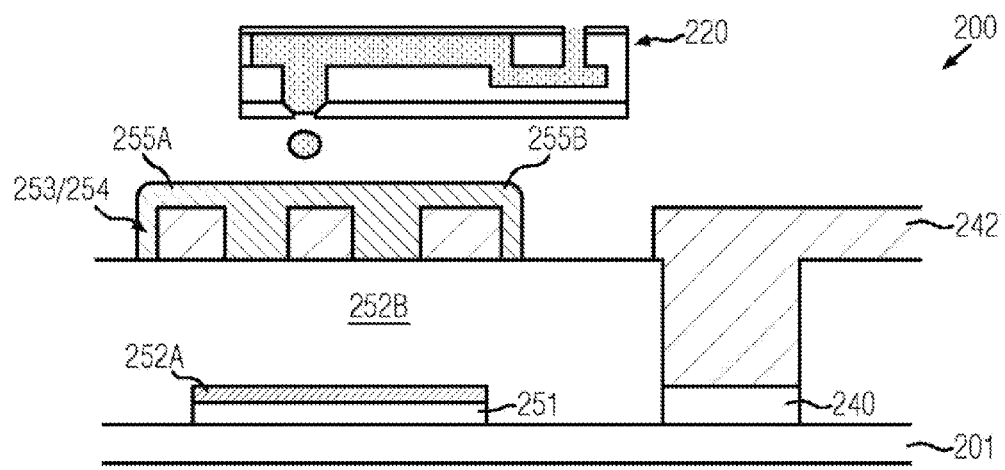
Figure 2U:
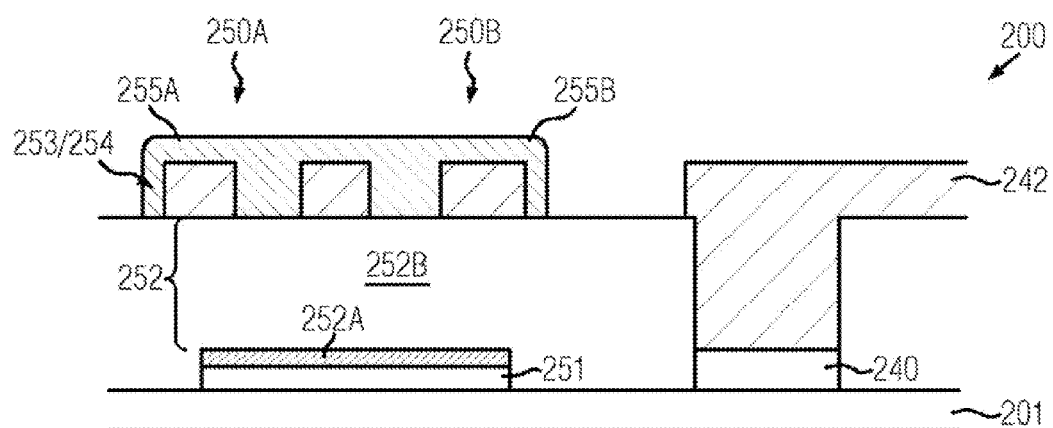

With reference to FIGS. 2A to 2U an illustrated embodiment of the present disclosure will now be described in more detail.

FIG. 2A schematically illustrates a cross-sectional view of an organic semiconductor device 200 in a manufacturing stage, in which a layer of conductive material 202 is formed on or above a substrate 201. Furthermore, a mask layer 203, in one illustrative embodiment in the form of a photo resist material, is formed so as to cover the conductive layer 202. The substrate 201 may be provided in the form of any appropriate carrier material, such as plastic material in the form of polyethylene naphthalate (PEN), polyimide, and the like. In other cases, any other appropriate carrier material may be used, for instance glass, semiconductor material, and the like. It should be appreciated, however, that cost efficient carrier materials, which may even be flexible, may be preferred so as to meet economic demands, as already discussed above. The conductive layer 202 may be provided in the form of any conductive material, such as a metal, and the like, wherein in one illustrative embodiment aluminum is used, which imparts a desired high conductivity to the gate electrode still to be formed and to a bottom contact structure, which is also to be formed from the conductive layer 202. The thickness of the layer 202 is selected so as to comply with the conductivity specifications for the gate electrode and the bottom contact structure, while also allowing a certain surface portion to be modified, for instance oxidized, if considered appropriate. For example, the layer 202 may have a thickness of several nanometers to 20 or 30 nm or more, depending on the overall device specifications. The layer 202 may be deposited by sputter deposition techniques, or any other appropriate physical vapor deposition process and the like, which are well-established in the semiconductor industry. Thereafter, the mask layer 203 may be deposited, for instance by spin coating.

FIG. 2B schematically illustrates the semiconductor device 200 in a further advanced manufacturing stage, in which an optical lithography process is performed by using a lithography mask 205, i.e., a non-contact mask, which is exposed by radiation 204, such as UV radiation, using any appropriate exposure wavelength in compliance with the available deposition tools. The lithography mask 205 therefore defines the lateral position, size and shape of gate electrodes and bottom contact structures to be formed in the layer 202.

FIG. 2C schematically illustrates the semiconductor device 200 after a development process, in which exposed portions of the mask layer 203 (FIG. 2B) have been removed on the basis of well-established process recipes, thereby obtaining a first etch mask 206 for defining portions of the layer 202, which are to be preserved as gate electrodes and contact structures.

FIG. 2D schematically illustrates the device 200 during a corresponding patterning process 207, in which appropriate and well-established etch chemicals are used for removing exposed portions of the layer 202, thereby forming a gate electrode 251 and a bottom contact structure 240, which is to be understood as any appropriate structure for routing signals in lateral and/or vertical direction after completing the semiconductor device 200. For example, the contact structure 240 may comprise contact pads for receiving respective contact elements in order to finally connect to the gate electrode 251, while in other cases the contact structure 240 additionally or alternatively is provided so as to connect to vertical contact elements in the form of vias, and the like. As is well known the etch process 207 may be conducted on the basis of wet chemical recipes or plasma assisted etch recipes with a high degree of selectivity with respect to the etch mask 206 and the substrate 201.

FIG. 2E schematically illustrates the semiconductor device 200 in a further advanced manufacturing stage, in which a further exposure process 208 is applied on the basis of a further lithography mask 209 in order to selectively expose the etch mask 206. That is, a portion 206A of the mask is exposed to be removed in a further process step, while exposure of a portion 206B formed above the contact structure 240 is blocked by the lithography mask 209. In this manner, a corresponding electrochemical reaction is selectively induced in the portion 206A so as to allow a subsequent removal of this portion.

FIG. 2F schematically illustrates the device 200 after the selective removal of the portion 206A, for instance based on a development process, thereby exposing the gate electrode 251, while still covering the contact structure 240. Thereafter, the gate electrode 251 is subjected to a surface treatment 209, which in one illustrative embodiment may be performed as an oxidation process, in which an oxidizing ambient is established so as to form a first portion 252A of a gate dielectric material. For example, when using aluminum as the material of the gate electrode 251 the process 209 may be performed in ambient air so as to form a native oxide layer. In other cases, an oxidizing ambient may be established by generating plasma and the like in order to obtain a desired increased thickness of the dielectric layer 252A. On the other hand, at least a top surface of the contact structure 240 is reliably protected by the remaining portion 206B of the previously formed etch mask 206 (FIG. 2C). Depending on the base material of the gate electrode 251, a respective metal oxide and the like may be formed. For example, aluminum oxide may be formed with a thickness of one to several nanometers, depending on the overall device specifications. The surface treatment 209 may also include other processes, such as the incorporation of nitrogen and the like, if considered appropriate for adjusting permittivity and/or charge carrier blocking characteristics.

FIG. 2G schematically illustrates the semiconductor device 200 after forming a second portion 252B of the gate dielectric material. To this end, any appropriate dielectric material may be applied, for instance organic dielectric materials as are well-established in the art, while in other cases even inorganic materials may be used, wherein, if considered appropriate, even SAMs may be applied. It should be appreciated, however, that typically a high-performance SAM-based dielectric material may desire relatively long process time of 16 hours, as for instance described in "Ultralow-power organic complementary circuits", doi: 10.1038/nature05533, Nature 445, 745-748 (15 Feb. 2007). According to this document complementary transistors are formed on the basis of two different types of organic semiconductor material, wherein a thin SAM dielectric of approximately 2 nm is used in combination with aluminum oxide in order to obtain high performance inverters and other logic gates. However, in many cases the very long process time for forming the SAM dielectric may significantly contribute to increased production costs in volume production environments.

On the other hand, according to preferred embodiments of the present disclosure the dielectric material 252B may be provided in the form of any desired material, wherein a thickness thereof is adjustable within a wide range in order to address the various specifications in terms of gate leakage currents, permittivity for appropriately control a current flow in a channel region, and the like. Furthermore, by providing the gate dielectric material in the form of the portions 252A, 252B a moderately high k-value may be obtained by the layer 252A, which at the same time provide for reduced gate leakage currents. On the other hand, the dielectric material 252B may be selected with respect to interface characteristics with one or more organic semiconductor materials still to be formed. Furthermore, it should be appreciated that a thickness of the layer 252B does not need to be selected so as to cover the preserved resist mask 206B. For example, if a reduced thickness of the layer 252B is desired, the deposition process, such as a spin coating process, may be controlled so as to obtain the desired thickness, irrespective of whether an upper portion of the resist mask 206B remains uncovered. In other cases, a mild polishing process, or any other type of material removal process may be applied so as to adjust a finally desired thickness of the layer 252B prior to depositing the next material layer.

FIG. 2H schematically illustrates the device 200 with a further mask layer 210, such as a resist material, being formed on or above the dielectric material 252B.

FIG. 2I schematically illustrates the device 200 during a further lithography process, in which a lithography mask 212 is used during an exposure process 211, for instance based on UV radiation, in order to define the lateral position, size and shape of an opening to be formed so as to finally connect to the contact structure 240. To this end, any well-established process tools and recipes may be applied.

FIG. 2J schematically illustrates the device 200 in a further advanced stage, in which the mask layer 210 (FIG. 2I) is structured into an etch mask 213 based on any appropriate resist patterning recipe.

FIG. 2K schematically illustrates the device 200 after performing a material removal process so as to form a first portion of an opening 2520 that is aligned to the contact structure 240. During the material removal process, which may be applied as a plasma etching process, and the like, the preserved resist mask 206B is exposed, i.e., a top surface thereof, and may also act as an etch stop material.

FIG. 2L schematically illustrates the device 200 during a further exposure process 214, in which a photochemical reaction is induced in any exposed resist material, i.e., in the etch mask 213 and the exposed mask 206B. Consequently, the exposed resist material may efficiently be removed on the basis of well-established development techniques. The material removal process is performed in a controlled process atmosphere so as to substantially avoid undue interaction of the process atmosphere with the contact structure 240. For example, the presence of oxygen or any other aggressive component may substantially be suppressed in order to prevent oxidation or any other unwanted surface reaction in the contact structure 240. For example, a nitrogen atmosphere may be established during the resist development process in order to suppress oxidation of the contact structure 240.

FIG. 2M schematically illustrates the semiconductor device 200 after the removal of the exposed resist material, thereby completing the opening 2520 so as to extend down to the contact structure 240 and exposing a top surface 240S thereof. As discussed above, undue surface modification of the top surface 240S may be avoided by establishing an appropriate "inert" process atmosphere during the removal of the resist material and after exposure of the top surface 240S. In this manner, the formation of native oxide on the top surface 240S may be avoided, when, for instance, aluminum is used as material for the contact structure 240.

FIG. 2N schematically illustrates the semiconductor device 200 in a further advanced manufacturing stage. As shown, a conductive layer 256, such as a metal layer, and the like, is formed above the dielectric material 252B and within the opening 2520 so as to form a contact element 241 therein. Moreover, a mask layer 215, such as a resist layer, is formed above the conductive layer 256. The layer 256 may be deposited on the basis of any appropriate deposition technique, such as physical vapor deposition, sputter deposition, and the like, wherein, as discussed above, an appropriate process atmosphere is maintained in order to avoid undue surface modification of the surface 240S. For example, the presence of oxygen is significantly reduced in order to avoid undue oxidation of the top surface 240S at least at the beginning of the deposition of the conductive material 256. The conductive material 256 is typically selected so as to comply with the electronic characteristics of the one or more organic semiconductor materials still to be applied, wherein, for instance, gold, chromium, calcium, and the like have proven to be viable materials for matching the HOMO/LUMO configuration of well-established organic semiconductor materials, as for instance already described above. If considered appropriate, a mild planarization step may be introduced to improve overall surface topography. In other cases, the mask layer 215 may directly be formed on the conductive material 256, for instance by spin coating, without further process steps.

FIG. 2O schematically illustrates the semiconductor device 200 during a further lithography process, in which the mask material 215 is exposed to radiation 216 through a lithography mask 217, which may define the lateral position, size and shape of drain and source electrodes and of contact elements and an interconnect structure connecting to the bottom contact structure 240. The lithography process based on the exposure 216 and the lithography mask 217 may be performed by applying any appropriate process recipe.

FIG. 2P schematically illustrates the device 200 after the removal of exposed portions of the mask layer 217, thereby obtaining an etch mask 218.

Figure 1A:
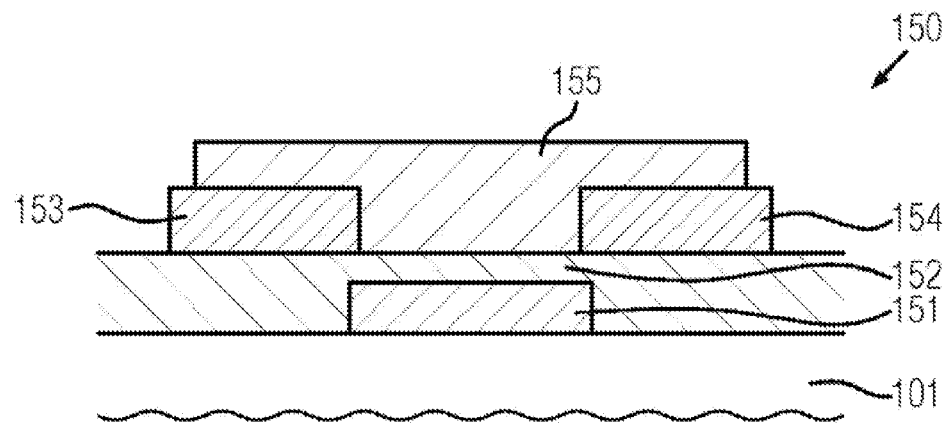
FIG. 1A is a schematic cross-sectional view of an organic TFT with a bottom gate-bottom contact topology, as may be used in preferred embodiments of the present disclosure.
Figure 1B:
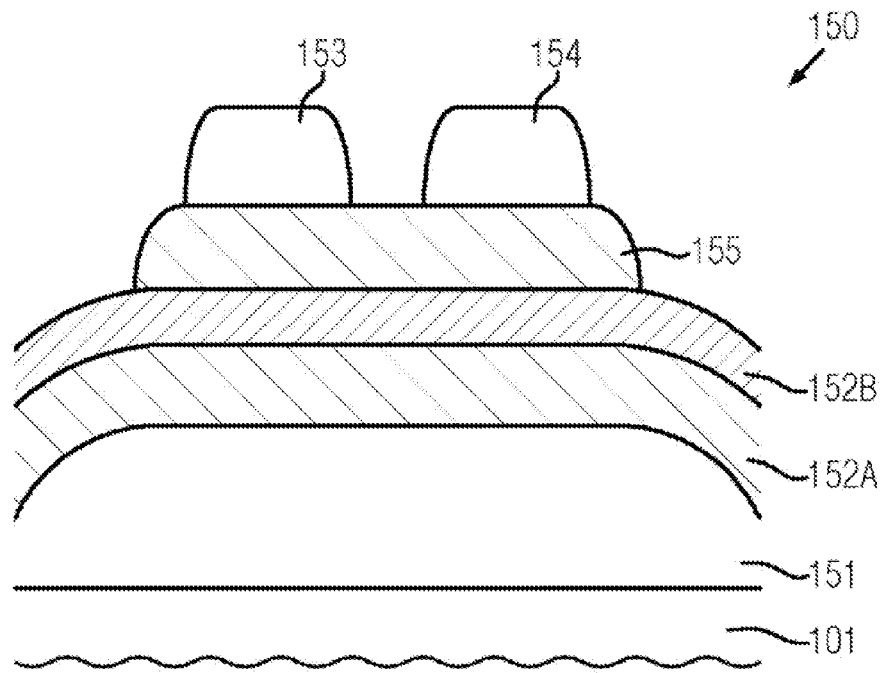
FIG. 1B is a schematic cross-sectional view of a TFT formed on the basis of evaporation and solvent processes with sophisticated SAMs and source and drain electrodes formed on the organic semiconductor material, wherein four TFTs may be grouped to a pseudo-CMOS configuration according to conventional techniques, and FIGS. 2A to 2U schematically illustrate cross-sectional views of an organic semiconductor device during various manufacturing stages in forming a bottom gate-bottom contact configuration on the basis of a hybrid deposition and patterning regime, in which organic semiconductor materials are formed as a last layer of the process on the basis of a printing process.

FIG. 2Q schematically illustrates the device 200 after having performed an etch process, such as a wet chemical etch process, a plasma-based etch process, the like, in order to remove non-covered areas of the conductive layer 256 (FIG. 2P), thereby forming drain and source electrodes 253/254 and an interconnect structure 242 in combination with the contact element 241. It should be appreciated that the drain/source configuration 253/254 in combination with the gate electrode 251 may represent a double transistor configuration, for instance representing a complementary transistor pair, if two different types of semiconductor material are provided in a later manufacturing stage. In other cases, the electrode configuration 253/254 as shown may represent a single transistor, while in still other cases only two drain/source electrodes may be provided for each transistor, as for instance explained with reference to the device structure shown in FIG. 1A. In one illustrative embodiment, the drain and source electrodes 253/254 and the contact element 241 and the interconnect structure 242 may be comprised of gold, chromium, calcium, corresponding alloys, or any other appropriate material, as already discussed above. Moreover, a thickness of the electrodes 253, 254 and 242 may be adjusted in accordance with the overall process and device specifications and may be in the range of 5 to 50 nm.

FIG. 2R schematically illustrates the device 200 when exposed to radiation 219 in order to induce a photochemical reaction in the mask 218. For example, UV radiation may be used in combination with well-established resist materials.

FIG. 2S schematically illustrates the device 200 after the removal of the exposed resist material, which may be accomplished on the basis of any well-established development recipe. Consequently, the device 200 comprises the drain and source electrodes 253/254 and the interconnect structure 242, wherein, however, due to the previous processing of any underlying materials and structures a merely moderately pronounced surface topography is present for the further processing of the device 200. That is, in particular the deposition of the dielectric material 252B may result in a substantially planar surface topography prior to the deposition and patterning of the drain and source electrodes 253/254 and the interconnect structure 242. Since the conductive material of the electrodes may be provided with a small thickness the resulting surface topography is significantly less sophisticated compared to other conventional process regimes, in which deposition strategies based on shadow masks and solvent processing are applied. Therefore, one or more organic semiconductor materials may readily be applied by a printing process, such as inkjet printing, wherein typical characteristics, such as reduced resolution, sensitivity to materials and process atmospheres, and the like are taken account of by providing reduced surface topography and applying the one or more semiconductor materials as the last layer(s) of the transistor configuration.

FIG. 2T schematically illustrates the semiconductor device 200 during one or more printing processes 220, in which one or more organic semiconductor materials, such as a p-type material and an n-type material are selectively formed above and between the drain and source electrodes 253/254. As is well known inkjet printing or other printing processes may allow a spatially selective deposition of solvent-based organic semiconductor materials so that these materials may directly be positioned on and above the active area(s) of the device 200. For example, a p-type semiconductor material 255A, such as pentacene and the like, may be deposited above and between electrodes that may correspond to a p-channel transistor, while an n-type semiconductor material 255B may be deposited above and between electrodes that corresponds to n n-channel transistor. Consequently, the one or more organic semiconductor materials 255A, 255B may be deposited in a spatially selective manner without requiring a further lithography step, thereby contributing to significantly reduced overall production costs. Thus, contrary to conventional strategies, in which organic semiconductor materials may be applied on the basis of lithography processes, two lithography steps may be replaced with the printing process 220, while still reliably avoiding the disadvantages that are conventionally associated with the application of inkjet printing techniques upon forming organic semiconductor devices.

FIG. 2U schematically illustrates the semiconductor device 200 after completing the printing process 220 (FIG. 2T). As shown, the device 200 comprises a transistor configuration with at least one organic semiconductor material formed between and above the drain and source electrodes 253/254. In the example shown it may be assumed that a first transistor 250A, i.e., a p-type or an n-type transistor, is provided in combination with a second transistor 250B, i.e., an n-type or a p-type transistor, thereby forming a complementary transistor pair. It should be appreciated, however, that also spatially separated transistors of different type may be provided, wherein a similar transistor configuration as for instance described above with reference to FIG. 1A may be used. Also in this case the same process strategy may be applied. The drain and source electrodes 253/254 are provided in the form of any appropriate conductive material, such as gold, chromium, calcium, and the like according to the HOMO and LUMO levels of the organic semiconductor material(s). Moreover, the device 200 comprises a gate dielectric 252, which may include two different dielectric materials, such as the layer 252A, for instance provided in the form of a metal oxide, such as aluminum oxide, and the dielectric material 252B, for instance provided in the form of an organic dielectric, and the like. As previously discussed, the overall characteristics of the gate dielectric 252 may be adjusted on the basis of two different processes, thereby achieving a high degree of flexibility in selecting and thus adjusting the desired transistor characteristics. For example, the thickness and type of material of the layer 252A may be adjusted on the basis of a surface modification of the base material of the gate electrode 251, for instance by performing an oxidation process or any other surface modification so as to adjust the dielectric characteristics as well as a thickness of the layer 252A. For example, additionally or alternatively to forming an oxide nitrogen may be incorporated into the layer 252A on the basis of a plasma treatment, and the like. Furthermore, the characteristics of the layer 252B may be adjusted by selecting an appropriate material and adjusting a desired layer thickness during the deposition process and/or after the deposition by applying an additional planarization/removal process.

It should be appreciated that, if desired, the dielectric layer 252B may be provided in the form of two or more sub-layers so as to be able to adjust interface characteristics and overall dielectric characteristics independently. To this end, a thin surface layer may be provided so as to substantially determine the charge carrier transport characteristics at the interface with the one or more organic semiconductor materials. On the other hand, the remaining material of the layer 252B may be selected with respect to leakage current behavior and permittivity.

As a consequence, one or more embodiments of the present disclosure provides organic CMOS technology based on a bottom gate/bottom contact TFT configuration, in which a hybrid process strategy, combining lithography techniques and printing processes, results in high production yield at reduced process costs compared to conventional strategies, in which the organic transistor configuration is formed on the basis of lithography steps. That is, the application of two different types of organic semiconductor materials is accomplished on the basis of a printing process rather than using two additional lithography steps.

The non-patent publications referred to in this specification are incorporated herein by reference, in their entirety and for all purposes. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
   forming a thin-film transistor, wherein forming the thin-film transistor includes:
   using lithography techniques, forming a gate electrode, a gate dielectric, and source and drain electrodes above a substrate; and
   using a printing process, forming a patterned organic semiconductor material above the substrate and surrounding the source and drain electrodes.

2. The method of claim 1, wherein forming the patterned organic semiconductor material comprises forming a p-type organic semiconductor material above said source and drain electrodes and said gate dielectric.

3. A method comprising:
   forming a thin-film transistor, wherein forming the thin-film transistor includes:
   using lithography techniques, forming a first gate electrode, a gate dielectric, first a source electrode, and a first drain electrode above a substrate;
   forming a second gate dielectric over the first gate dielectric and a second source electrode, and a second drain electrode; and
   using a printing process, forming a patterned organic semiconductor material above the substrate, wherein forming the patterned organic semiconductor material comprises forming a p-type organic semiconductor material above the first source and drain electrodes and said gate dielectric and forming an n-type organic semiconductor material above the second source and drain electrodes and the second gate dielectric.

4. The method of claim 1, wherein forming the gate electrode comprises patterning a conductive layer formed above said substrate prior to forming said gate dielectric, wherein patterning the conductive layer further includes forming a contact structure.

5. The method of claim 4, wherein patterning said conductive layer comprises forming a first resist mask above said conductive layer and defining a lateral size and shape of said gate electrode and said contact structure and removing non-covered areas of said conductive layer.

6. The method of claim 5, further comprising removing portions of said first resist mask from above said gate electrode and exposing a surface of said gate electrode while maintaining portions said first resist mask above said contact structure.

7. The method of claim 6, wherein removing portions of said first resist mask comprises selectively exposing resist material formed above said gate electrode with radiation while masking said resist material formed above said contact structure, and selectively removing said exposed resist material.

8. The method of claim 6, wherein forming said gate dielectric comprises surface treating said exposed surface and forming an insulating layer as a first portion of said gate dielectric.

9. The method of claim 7, wherein forming said gate dielectric comprises depositing a dielectric material while said first resist mask is located above said contact structure.

10. The method of claim 9, further comprising patterning said dielectric material and forming an opening that extends to said contact structure.

11. The method of claim 10, wherein patterning said dielectric material comprises forming a second resist mask above said dielectric material that defines a lateral size, position and shape of said opening, performing a removal process based on said second resist mask that exposes said first resist mask and removing said first and second resist masks.

12. The method of claim 11, wherein removing said first and second resist masks comprises establishing a process atmosphere and preventing surface degradation of said contact structure.

13. The method of claim 3, wherein forming said first source and drain electrodes comprises forming a layer of conductive material and patterning said layer of conductive material by using a resist mask and performing an etch process.

14. The method of claim 13, wherein patterning said layer of conductive material comprises forming a contact element that connects to said contact structure.

15. The method of claim 13, further comprising removing said resist mask by exposing material of said resist mask to radiation and removing said exposed material.

16. The method of claim 1, wherein said printing process is an inkjet printing process.

17. A method comprising:
   using lithography techniques, forming a gate electrode over a surface of a substrate;
   using lithography techniques, forming a gate dielectric over the gate electrode, wherein forming the gate dielectric over the gate electrode comprises forming a first dielectric layer of a first material and forming a second dielectric layer of a second material;
   using lithography techniques, forming source and drain electrodes over the gate dielectric; and
   using a printing process, depositing organic semiconductor material over and between the source and drain electrodes.

18. The method of claim 17, wherein the second dielectric layer is an organic dielectric that is located over the first dielectric layer.

19. A method comprising:
   using lithography techniques, forming a gate electrode over a surface of a substrate;
   using lithography techniques, forming a gate dielectric over the gate electrode;
   using lithography techniques, forming source and drain electrodes over the gate dielectric, wherein forming source and drain electrodes over the gate dielectric comprises forming a drain electrode and a plurality source electrodes over the gate dielectric, or forming a source electrode and a plurality of drain electrodes over the gate dielectric; and using a printing process, depositing organic semiconductor material over and between the source and drain electrodes, wherein depositing organic semiconductor material includes depositing a p-type organic semiconductor material over a first set of the source and drain electrodes and depositing an n-type organic semiconductor material over a second set of the source and drain electrodes.

20. The method of claim 19, wherein said printing process is an inkjet printing process.

21. The method of claim 17, wherein said printing process is an inkjet printing process.

* * * * *